United States Patent [19]
Solo de Zaldivar

[11] Patent Number: 5,610,084
[45] Date of Patent: Mar. 11, 1997

[54] METHOD OF MANUFACTURING AN ANTIFUSE UTILIZING NITROGEN IMPLANTATION

[75] Inventor: Jose Solo de Zaldivar, Wadenswil, Switzerland

[73] Assignee: U.S. Phillips Corporation, New York, N.Y.

[21] Appl. No.: 488,541

[22] Filed: Jun. 7, 1995

[30] Foreign Application Priority Data

Apr. 21, 1995 [EP] European Pat. Off. ............ 95201019

[51] Int. Cl.$^6$ ...................... H01L 21/8247; H01L 21/265
[52] U.S. Cl. .................. 437/24; 437/43; 437/60; 437/922; 257/530
[58] Field of Search ................. 437/24, 43, 60, 437/522; 257/530

[56] References Cited

U.S. PATENT DOCUMENTS

| | | |
|---|---|---|
| 4,757,359 | 7/1988 | Chiao et al. . |
| 4,774,197 | 9/1988 | Haddad et al. ............ 437/27 |
| 4,922,319 | 5/1990 | Fukushima . |
| 5,508,220 | 4/1996 | Eltoukhy et al. ............ 437/60 |
| 5,518,936 | 5/1996 | Yamamoto et al. .......... 437/24 |

*Primary Examiner*—John Niebling
*Assistant Examiner*—Richard A. Booth
*Attorney, Agent, or Firm*—Michael E. Schmitt

[57] ABSTRACT

A method of manufacturing a programmable semiconductor element in the form of an anti-fuse, comprising a thin layer of silicon oxide between two electrode regions, such that a connection can be formed between these electrode regions through electric breakdown in the oxide. In the method, a nitrogen implantation is first carried out at the area of the oxide to be formed, so that a thin layer comprising nitrogen is formed at the surface, which has an oxidation-decelerating effect. Then the oxide is provided through thermal oxidation. Owing to the oxidation-decelerating effect of the layer with nitrogen, an extremely thin oxide layer, for example 5 nm thick, may be obtained in a reproducible manner in a sufficiently long oxidation time.

6 Claims, 2 Drawing Sheets

5,610,084

METHOD OF MANUFACTURING AN ANTIFUSE UTILIZING NITROGEN IMPLANTATION

BACKGROUND OF THE INVENTION

The invention relates to a method of manufacturing a semiconductor device whereby a silicon body is provided at a surface with a programmable element in the form of an anti-fuse comprising a thin silicon oxide layer situated between a surface zone in the semiconductor body and an electrode applied on the silicon oxide layer, the anti-fuse being brought from a first, non-conducting state into a second, conducting state during programming in that a voltage is applied between the electrode and the surface zone. The invention also relates to a semiconductor device manufactured by such a method.

Such a method and a device manufactured by this method are known inter alia from U.S. Pat. No. 4,757,359. The anti-fuse described therein comprises a thin silicon oxide layer with a thickness of between 8 and 11 nm arranged between two electrodes. A Fowler-Nordheim tunnelling current occurs through the oxide when a voltage is applied between the electrodes. A conductive connection between the electrodes is formed at a certain quantity of charge. The element can be programmed in this way and, for example as a memory element, can form a programmable memory (PROM) together with identical elements. A voltage of 10 V is used for programming the known anti-fuse, and preferably 15 V. It is often desirable to use a lower voltage, i.e. lower than 10 V; however, this is impossible because the programming times would become too long given the above thickness of the oxide layer. A further reduction in the thickness of the anti-fuse oxide, whereby said disadvantages could be at least partly eleiminated, has the drawback that it is difficult to manufacture such thin layers in a reproducible manner. In general, the time required for forming an oxide layer of 5 nm is much too short for a standard i.e. process. Moreover, the quality of such extremely thin oxide layers is often found to be poor, in particular owing to the presence of pinholes.

SUMMARY OF THE INVENTION

The invention has for its object inter alia to provide a method whereby it is possible to manufacture an oxide layer with a thickness below 8 nm and of good quality in a reproducible manner.

According to the invention, a method of the kind described in the opening paragraph is for this purpose characterized in that the semiconductor body is doped with nitrogen at the area of the silicon oxide layer to be formed, after which the silicon oxide layer is formed through thermal oxidation. As will be explained in more detail below, a thin silicon nitride layer is formed by the nitrogen doping, which decelerates the oxidation. The formation of a very thin oxide layer, for example of 5 nm, may now be carried out in a time which is sufficiently long, for example approximately 15 minutes, for manufacturing integrated circuits in a reproducible manner. It was further found that the anti-fuse oxide thus formed is of excellent quality and is at least substantially free from pinholes.

An embodiment in which favourable results are obtained is characterized in that the semiconductor body is doped by means of an implantation of nitrogen ions in a concentration which lies between $2 \times 10^{14}$ per $cm^2$ and $5 \times 10^{14}$ per $cm^2$.

A further major embodiment of a method according to the invention is characterized in that the semiconductor body is also provided with a non-volatile memory element in the form of a field effect transistor with a floating gate which is locally separated from the surface of the semiconductor body by tunnel oxide, in that during the nitrogen doping the surface is masked against this doping at the area of the tunnel oxide to be provided, and in that simultaneously with the oxidation performed for obtaining the silicon oxide layer also the tunnel oxide is provided to a thickness which is greater than the thickness of the silicon oxide layer of the anti-fuse. This further aspect of the invention is based on the recognition that simultaneous oxidation of a portion of the silicon body not doped with nitrogen will cause an oxide layer which is thicker than the anti-fuse oxide, but still sufficiently thin, for example 10 nm, for Fowler-Nordheim current as used for charging or discharging a floating gate. The use thereof renders it possible to combine an erasable, non-volatile memory, for example an EEPROM, in which the written information can be erased, with a PROM which cannot be erased but whose elements in addition to the advantages described above have the additional advantage that they are much smaller than the EEPROM cells and are accordingly particularly suitable for data which need be entered only once. A preferred embodiment of this method is characterized in that, given a certain concentration of the nitrogen atoms, the oxidation is carried out such that the thickness of the tunnel oxide is approximately 10 nm and the thickness of the silicon oxide layer of the anti-fuse is at most approximately 6 nm.

BRIEF DESCRIPTION OF THE DRAWINGS

The invention will be explained in more detail with reference to a few embodiments and the accompanying diagrammatic drawing, in which.

DESCRIPTION OF THE PREFERRED EMBODIMENTS

Figure 1A:
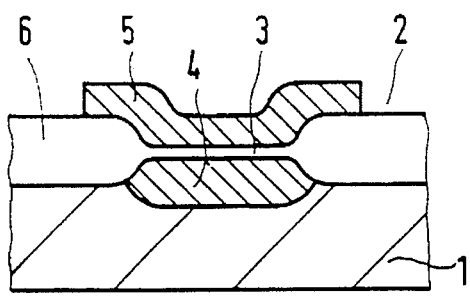
FIGS. 1A–1D in cross-section shows a programmable semiconductor element in a few stages of manufacture.

FIG. 1a is a cross-section of an anti-fuse manufactured by a method according to the invention. The anti-fuse shown may form a programmable read-only memory (PROM) or a PLD (programmable logic device) together with similar programmable elements. In other versions, the element may be used for forming a selective connection in an integrated circuit, for example for redundancy. The device comprises a silicon body with a surface region 1 of a first conductivity type, in this example the p-type, which adjoins a surface 2. The anti-fuse comprises a thin layer 3 of silicon oxide formed at the surface 2 and two electrodes, one on either side of the silicon oxide layer 3. One of these electrodes is formed by a surface zone 4 of the second conductivity type opposed to the first, so in this example the n-type, which is provided in the silicon body 1. The other electrode 5 is formed by a conductive layer which is provided on the silicon oxide layer 3. In this example, the electrode 5 is formed by n-type doped polycrystalline silicon, or poly, but it will be obvious that alternatively the electrode 5 may also be made of a suitable metal instead of poly. The silicon oxide layer 3 is laterally bounded by thicker field oxide 6.

In the situation shown in FIG. 1, the electrode 5 and the zone 4 are electrically insulated from one another. The anti-fuse can be programmed in that a voltage is applied between the zone 4 and the electrode 5, whereby conduction across the oxide layer 3 arises after a certain time. The thickness of the oxide layer is taken as small as possible in order to keep both the programming time and the programming voltage at suitable low levels, for example, below 1 ms and 10 V, respectively. In this example, the thickness of the oxide layer 3 lies between 5 and 6 nm. Such a cell can be programmed within 0.2 ms with a voltage of approximately 8 V. During programming, electric breakdown takes place locally across the oxide, so that a conductive connection between the electrodes 4 and 5 is formed. The resistance of this connection may vary from approximately 100 ohms to approximately 1000 ohms.

The cell may be used as a memory element in a PROM, where the zone 3 is connected to or forms part of one of the source and drain regions of a selective MOST.

Figure 1C:
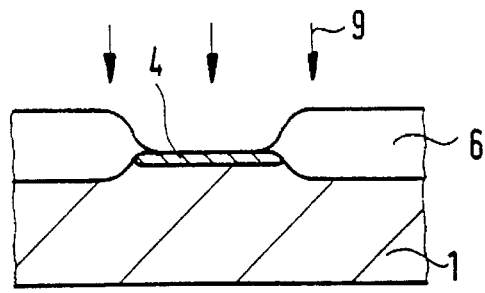
Figure 1B:
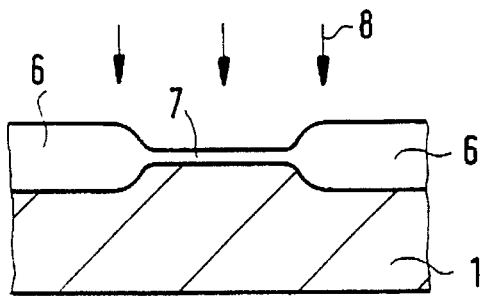
Figure 1D:
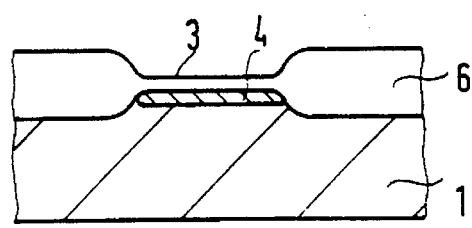
Figure 2:
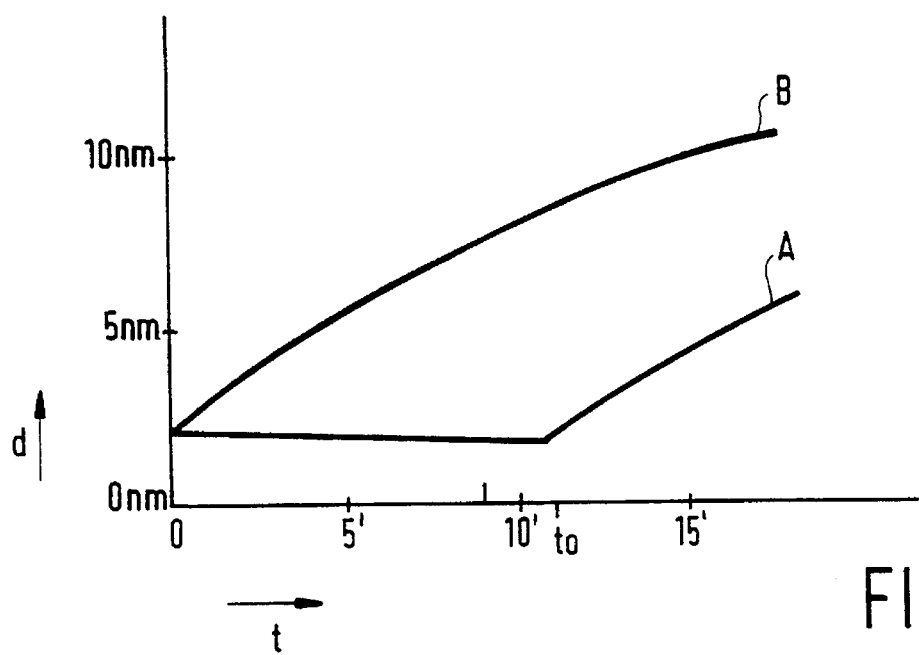
FIG. 2 is a graph showing the relation between the thickness of the oxide layer and the duration of the oxidation process.

A method will be described with reference to FIGS. 1b–1d whereby an extremely thin oxide layer 3 of high quality can be obtained in a reproducible manner. The method starts in FIG. 1b with the p-type silicon substrate 1 which is provided with the field oxide 6 in a usual manner. An approximately 30 nm thick oxide layer 7 is provided, for example simultaneously with the provision of gate oxide elsewhere in the circuit, in the location where the anti-fuse oxide 3 will be grown in a later stage. The semiconductor body 1 is doped with an n-type impurity through implantation 8 of, for example, phosphorus ions for the n-type zone 4 to be formed. The oxide layer 7 is subsequently removed. In a next stage shown in FIG. 1c, a nitrogen implantation 9 is carried out at the area of the anti-fuse to be formed. The implantation energy may be so chosen that the field oxide 6 masks the subjacent silicon against implantation. Elsewhere in the circuit, where the surface is not covered by thick field oxide, the surface may be masked in a usual manner, for example, with a photoresist layer. The implantation dose may be chosen in dependence on the desired oxide thickness and the circumstances under which the oxidation is carded out. In the present example, the implantation dose is approximately $4 \times 10^{14}$ ions per $cm^2$. After removal of photoresist layers, the anti-fuse oxide 3 is grown through thermal oxidation (FIG. 1d). This step is carded out, for example at 900° C. for 15 minutes in an atmosphere containing $N_2/O_2$/HCl. It is found that under these circumstances an oxide layer of approximately 5 nm is formed at the area of the n-type implantation. In FIG. 2, curve A shows the relation between the oxidation time t, plotted on the horizontal axis (in minutes), and the oxide thickness d, plotted on the vertical axis (in nm). The process starts with a thin oxide layer of approximately 2 nm which is present on the surface through natural causes. No or substantially no growth takes place for a few minutes, up to $t_0$, depending in particular on the nitrogen doping. Starting from $t_0$, the oxide grows at a rate which is normal for the circumstances mentioned above, after which within a few minutes a thickness of 5 nm has been obtained. For comparison, curve B shows the relation between oxidation thickness and oxidation time for silicon not doped with nitrogen. The thickness of 5 nm is obtained within a very short time, in this example within 4 minutes, which is in general too short for a reproducible mass manufacture. The explanation of the difference between the two curves lies in the fact that the nitrogen implantation forms a thin silicon nitride layer of approximately 1 nm thickness at the surface which masks the subjacent silicon against oxidation, so that the formed genetic oxide of 2 nm does not become thicker. During the oxidation step, this silicon nitride is first convened into silicon oxide. It is not until the nitride has disappeared completely that the oxide will grow further at the normal growing rate depicted in curve B.

The oxide layer of 5 nm obtained in the manner described above was found to be of excellent quality, in spite of its small thickness, and practically free from pinholes. This renders the process described here suitable for the manufacture of a PROM with a large number of memory elements in the form of anti-fuses which can be programmed at a comparatively low voltage.

Figure 3:
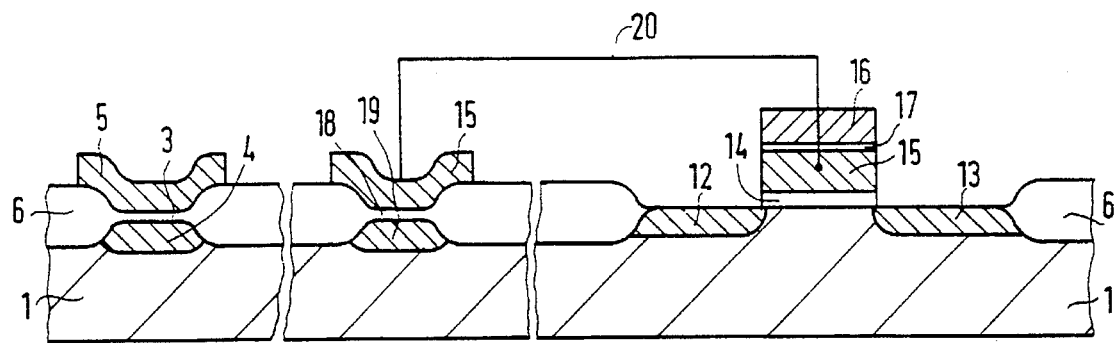
FIG. 3 is a cross-section of a second semiconductor device manufactured by a method according to the invention.

FIG. 3 is a cross-section of a semiconductor device in which an anti-fuse according to the preceding embodiment is combined with an erasable non-volatile memory such as an EEPROM. Together with a select-transistor, not shown in the drawing, the antifuse cell may be pan of a one-time programmable ROM. The anti-fuse pictured in the left-hand part of the drawing has been given the same reference numerals for components corresponding to those in the preceding embodiment, and again comprises an approximately 5 nm thick oxide layer 3 between the electrode 5 and the surface zone 4. The non-volatile memory element comprises a floating-gate MOST with n-type source and drain zones 12 and 13 provided in the p-type region 1. The floating gate 15 is provided above the channel region between the source and drain zones, is separated from the channel region by a gate oxide 14, and forms a storage location for information in the form of electric charge, as is known. The transistor further comprises a usual control electrode 16, separated from the floating gate 15 by a thin insulating layer 17. Electric charge may be transported to (or from) the floating gate 15 via thin tunnel oxide 18 which is formed locally between the floating gate and an n-type surface zone 19 in the semiconductor body 1. The tunnel oxide may be provided above the drain zone 12. In the present embodiment, the tunnel oxide is provided outside the region of the transistor 11. The associated portion of the floating gate is connected outside the plane of drawing to the portion of the gate 15 above the channel region, which is diagrammatically indicated with the connection 20. A specific thickness for the tunnel oxide 18 is 10 nm.

Figure 4A:
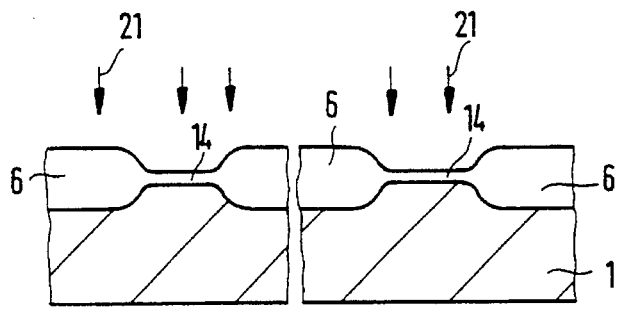
FIGS. 4A–4C shows a few stages in the manufacture of this semiconductor device.
Figure 4B:
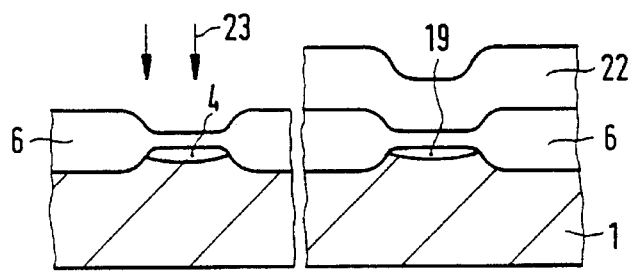
Figure 4C:
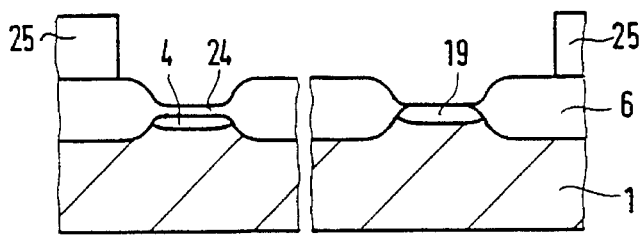

A method will be described with reference to FIG. 4 whereby the tunnel oxide 18 is manufactured simultaneously with the anti-fuse oxide 3. These Figures only show the portion of the semiconductor body 1 which comprises the anti-fuse and the tunnel oxide of the floating gate. The floating-gate MOST 11 itself is not depicted in FIG. 4. FIG. 4a shows the stage in which the silicon body 1 is provided with the thick field oxide 6 and the surface of the active regions is covered with a 30 nm thick gate oxide layer 14. An n-type doping, for example phosphorus, is provided by means of ion implantation, represented by arrows 21, in the portions of the surface covered by the gate oxide 14 for the purpose of the n-type zones 4 of the anti-fuse and the n-type zone 19 below the tunnel oxide which are to be formed. The implantation energy is so chosen that the ions do not penetrate through the field oxide 6. In a next stage, FIG. 4b, an implantation mask in the form of photoresist layer 22 is provided above the region of the tunnel oxide to be formed, leaving the region of the anti-fuse exposed. In a similar manner as in the preceding example, the region of the anti-fuse to be formed is doped with nitrogen through implantation of nitrogen ions, represented by arrows 23, so that locally a thin layer of silicon nitride 24 is formed which decelerates oxidation. After the implantation, the mask 22 is removed in a usual manner. Subsequently, a new mask 25 (FIG. 4c) is provided, which masks the regions where transistors, such as the floating-gate MOST 11, are to be formed but leaves the regions of the anti-fuse and the tunnel oxide exposed. The gate oxide 14 on the non-masked surface regions is then removed through etching, after which the mask 25 may also be removed. The anti-fuse oxide 3 is now formed by thermal oxidation in the manner described with reference to the preceding embodiment. An oxide layer 18 of approximately 10 nm thickness is formed in accordance with curve B in FIG. 2 at the area of the zone 19 where the surface is not doped with nitrogen.

The combination of the anti-fuse cell and floating-gate MOST as described here, where the anti-fuse oxide is thinner than the tunnel oxide of the floating-gate MOST, provides some important advantages in addition to those already mentioned. The floating-gate MOST 11 may form part of an EEPROM in which written information can be replaced by new data. The anti-fuse may form a PROM together with other cells in which information can be written which need not be changed any more. The use of a PROM for such information instead of an EEPROM leads to a major saving in space because the anti-fuse described here is much smaller than a floating-gate transistor. Owing to the small thickness of the oxide, the anti-fuse can be programmed with a voltage below 10 V, as noted above. In the process described here, moreover, the oxide of the anti-fuse can be manufactured simultaneously with the thicker tunnel oxide of the EEPROM cell.

It will be obvious that the invention is not limited to the embodiments given here, but that many more variations are possible to those skilled in the art within the scope of the invention. Thus, nitrogen implantation values other than those described here may advantageously be used, and the oxidation conditions, such as temperature and/or composition of the oxidizing environment, can be adapted to specific cases. The anti-fuse obtained may alternatively be used as a programmable element in, for example, a PLA instead of as a memory element.

What is claimed:

1. A method of manufacturing a semiconductor device whereby a semiconductor body is provided at a surface with a programmable element in the form of an anti-fuse comprising a thin silicon oxide layer situated between a surface zone in the semiconductor body and an electrode applied on the silicon oxide layer, the anti-fuse being brought from a first, non-conducting state into a second, conducting state during programming in that a voltage is applied between the electrode and the surface zone, characterized in that the semiconductor body is doped with nitrogen at the area of the silicon oxide layer to be formed, after which the silicon oxide layer is formed through thermal oxidation.

2. A method as claimed in claim 1, characterized in that the oxidation is continued until the silicon oxide layer has a thickness of at most approximately 8 nm.

3. A method as claimed in claim 2, characterized in that the oxidation is continued until the silicon oxide layer has a thickness of at most approximately 6 nm.

4. A method as claimed in claim 1, characterized in that the semiconductor body is doped by means of an implantation of nitrogen ions in a concentration which lies between $2 \times 10^{14}$ per $cm^2$ and $5 \times 10^{14}$ per $cm^2$.

5. A method as claimed in claim 1, characterized in that the semiconductor body is also provided with a non-volatile memory element in the form of a field effect transistor with a floating gate which is locally separated from the surface of the semiconductor body by tunnel oxide, in that during the nitrogen doping the surface is masked against this doping at the area of the tunnel oxide to be provided, and in that simultaneously with the oxidation performed for obtaining the silicon oxide layer the tunnel oxide is provided to a thickness which is greater than the thickness of the silicon oxide layer of the anti-fuse.

6. A method as claimed in claim 5, characterized in that the oxidation is carried out such that the thickness of the tunnel oxide is approximately 10 nm and the thickness of the silicon oxide layer of the anti-fuse is at most approximately 6 nm.

* * * * *